(12) United States Patent
Hong et al.

(10) Patent No.: US 12,543,606 B2
(45) Date of Patent: Feb. 3, 2026

(54) LIGHT EMITTING ELEMENT PACKAGE MANUFACTURING METHOD, DISPLAY APPARATUS, AND DISPLAY APPARATUS MANUFACTURING METHOD

(71) Applicant: LG ELECTRONICS INC., Seoul (KR)

(72) Inventors: Daewoon Hong, Seoul (KR); Taehyun Kim, Seoul (KR); Dahye Kim, Seoul (KR); Jaesang Min, Seoul (KR); Sangtae Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/292,714

(22) PCT Filed: Jun. 7, 2022

(86) PCT No.: PCT/KR2022/007976
§ 371 (c)(1),
(2) Date: Jul. 22, 2024

(87) PCT Pub. No.: WO2023/008726
PCT Pub. Date: Feb. 2, 2023

(65) Prior Publication Data
US 2024/0421133 A1    Dec. 19, 2024

(30) Foreign Application Priority Data

Jul. 30, 2021 (KR) .................. 10-2021-0100625

(51) Int. Cl.
*H01L 25/075* (2006.01)
*H10H 20/80* (2025.01)
(Continued)

(52) U.S. Cl.
CPC ....... *H01L 25/0753* (2013.01); *H10H 20/853* (2025.01); *H10H 20/857* (2025.01); *H10H 20/0362* (2025.01); *H10H 20/0364* (2025.01)

(58) Field of Classification Search
CPC ............ H20H 20/8585; H20H 20/857; H20H 20/0364; H10H 20/8585; H10H 20/857;
(Continued)

(56) References Cited

U.S. PATENT DOCUMENTS

| 2020/0193895 A1* | 6/2020 | Shao ........................ G09G 3/32 |
| 2022/0246089 A1* | 8/2022 | Song .................... H01L 25/0753 |
| 2024/0105758 A1* | 3/2024 | Ohtorii .................... G01S 7/484 |

FOREIGN PATENT DOCUMENTS

| CN | 112271175 A | 1/2021 |
| JP | 2021-44421 A | 3/2021 |

(Continued)

OTHER PUBLICATIONS

International Search Report for PCT/KR2022/007976 (PCT/ISA/210) mailed on Nov. 9, 2022.
(Continued)

*Primary Examiner* — Antonio B Crite
(74) *Attorney, Agent, or Firm* — Birch, Stewart, Kolasch & Birch, LLP

(57) ABSTRACT

The present invention relates to a light emitting element package manufacturing method and a display apparatus manufacturing method. According to an embodiment of the present invention, a light emitting element package manufacturing method may be provided, the method comprising the steps of: providing a substrate having, on one surface, a plurality of first pads and a plurality of second pads; arranging a plurality of light emitting elements on the substrate so that the light emitting elements are electrically connected to the plurality of second pads, respectively; arranging a plu-
(Continued)

rality of joint parts on the one surface of the substrate so that the joint parts are electrically connected to the plurality of first pads, respectively; and sawing the substrate so as to form a light source that has at least one of the plurality of light emitting elements.

17 Claims, 14 Drawing Sheets

(51) Int. Cl.
*H10H 20/84* (2025.01)
*H10H 20/85* (2025.01)
*H10H 20/852* (2025.01)
*H10H 20/853* (2025.01)
*H10H 20/857* (2025.01)
*H10H 29/10* (2025.01)
*H10H 29/14* (2025.01)
*H10H 20/01* (2025.01)

(58) Field of Classification Search
CPC ............ H10H 20/0364; H10H 20/852; H10H 20/0362; H10H 20/85; H10H 20/8506; H10H 29/10; H01L 25/0753
See application file for complete search history.

(56) References Cited

FOREIGN PATENT DOCUMENTS

| | | |
|---|---|---|
| JP | 2021-68795 A | 4/2021 |
| KR | 10-2001-0038119 A | 5/2001 |
| KR | 10-2009-0127108 A | 12/2009 |
| KR | 10-2014-0047123 A | 4/2014 |
| KR | 10-2020-0097941 A | 8/2020 |

OTHER PUBLICATIONS

Written Opinion of the International Searching Authority for PCT/KR2022/007976 (PCT/ISA/237) mailed on Nov. 9, 2022.

* cited by examiner

LIGHT EMITTING ELEMENT PACKAGE MANUFACTURING METHOD, DISPLAY APPARATUS, AND DISPLAY APPARATUS MANUFACTURING METHOD

CROSS REFERENCE TO RELATED APPLICATIONS

This application is the National Phase of PCT International Application No. PCT/KR2022/007976, filed on Jun. 7, 2022, which claims priority under 35 U.S.C. 119 (a) to Patent Application No. 10-2021-0100625, filed in the Republic of Korea on Jul. 30, 2021, all of which are hereby expressly incorporated by reference into the present application.

TECHNICAL FIELD

The present disclosure relates to a light emitting element package and a display device. For example. embodiments may be applied to a light emitting element package using a light emitting diode (LED) or a micro LED, a method for manufacturing the same, a display device, and a method for manufacturing the same.

BACKGROUND

Recently, in a field of a display technology, display devices having excellent characteristics such as thinness, flexibility, and the like have been developed. On the other hand. currently commercialized major displays are represented by a LCD (liquid crystal display) and an OLED (organic light emitting diode).

LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed.

Recently. such light emitting diode (LED) has been gradually miniaturized and manufactured into a micro-sized LED to be used as a pixel of the display device. Such micro LED technology exhibits characteristics of low power, high brightness, and high reliability compared to other display devices/panels, and is able to be applied to a flexible device as well. Therefore, in recent years, research institutes and companies have been actively researching the micro LED.

In one example, as a size of the LED becomes smaller, there are attempts to reduce a size of a light emitting element package to reduce a size of a bezel.

However, a printed circuit board (PCB) on which the LED is mounted and a driver to drive the LED were necessarily required for a semiconductor light emitting element package. Accordingly. it was difficult to reduce the size of the light emitting element package to a certain level or more because of a structural arrangement of an IC chip, an electrode, and the PCB for driving the LED.

In addition, even when the size of the light emitting element package was reduced by vertically arranging the IC chip, the electrode, and the PCB for driving the LED, an expensive process such as a through silicon via (TSV) process was required, which increased a cost.

SUMMARY

Technical Problem

Embodiments are to provide a light emitting element package in which a driver and a light emitting element are integrated with each other.

Further, embodiments are to provide a light emitting element package having a cross-sectional area reduced to a size of a cross-sectional area of a driver.

Further, embodiments are to provide a light emitting element package that does not require a separate substrate for the package in a process of manufacturing the light emitting element package.

Further, embodiments are to provide a method for manufacturing a light emitting element package that may manufacture a plurality of light emitting element packages at once.

Further, embodiments are to provide a method for manufacturing a light emitting element package that may freely adjust a spacing between a plurality of light emitting element packages.

Further, embodiments are to provide a method for manufacturing a display device that may easily manufacture an LED display device.

Technical Solutions

According to embodiments, provided is a method for manufacturing a light emitting element package including providing a substrate having a plurality of first pads and a plurality of second pads formed on one surface thereof, arranging a plurality of light emitting elements on the substrate to be electrically connected to the plurality of second pads, respectively, arranging a plurality of bonding portions on the one surface of the substrate to be electrically connected to the plurality of first pads, respectively, and sawing the substrate to form each light source including at least one of the plurality of light emitting elements.

According to embodiments, the method may further include forming a molding film covering the plurality of light sources. polishing the molding film to expose at least a portion of the bonding portion, and cutting the molding film such that each piece thereof includes at least one of the plurality of light sources.

According to embodiments, forming of the molding film may include arranging the plurality of light sources at a predetermined spacing, and fixing the plurality of light sources by forming the molding film to cover the plurality of light sources.

According to embodiments, the method may further include, before the sawing of the substrate, forming a molding film covering at least a portion of at least one of the plurality of light emitting elements, the bonding portion, and the one surface of the substrate, and polishing the molding film to expose at least a portion of the bonding portion, and the sawing of the substrate includes cutting the molding film and the substrate such that each piece thereof includes at least one of the plurality of light sources.

According to embodiments, providing of the substrate may further include performing a protective coating on the other surface of the driver.

According to embodiments, the bonding portion may include at least one of a solder ball, a copper bump, and a solder paste.

According to embodiments, provided is a method for manufacturing a display device including providing a base including a plurality of light sources including bonding portions, forming a molding film covering the plurality of light sources and one surface of the base, polishing the molding film to expose at least a portion of the bonding portion, and printing a wiring electrode connected to the bonding portion on the molding film.

According to embodiments, providing of the base may include arranging the plurality of light sources including the bonding portions on one surface of a printed circuit board (PCB).

According to embodiments, providing of the base may include providing a substrate having a plurality of first pads and a plurality of second pads formed on one surface thereof, arranging a plurality of light emitting elements on the substrate to be electrically connected to the plurality of second pads, respectively, and arranging the plurality of bonding portions on one surface of a driver to be electrically connected to the plurality of first pads. respectively.

According to embodiments, provided is a display device including a base including a plurality of light sources including bonding portions, a molding film covering the plurality of light sources and one surface of the base, a wiring electrode printed on the molding film to be connected to the bonding portion, and a via formed in the molding film to be connected to the wiring electrode, wherein at least a portion of the molding film is polished to expose the bonding portion.

According to embodiments, the base may include a printed circuit board having a plurality of light sources arranged on one surface thereof, and each of the plurality of light sources may include a substrate having a first pad and a second pad formed on one surface thereof, a light emitting element electrically connected to the second pad, and the bonding portion electrically connected to the first pad.

According to embodiments, the base may include a substrate having a plurality of first pads and a plurality of second pads formed on one surface thereof, a plurality of light emitting elements arranged to be electrically connected to the plurality of second pads. respectively, and the plurality of bonding portions arranged to be electrically connected to the plurality of first pads, respectively.

Advantageous Effects

The light emitting element package according to the embodiments may implement the light emitting element package in which the driver and the light emitting element are integrated with each other.

In the light emitting element package according to the embodiments, it is easy to repair the light source.

The light emitting element package according to the embodiments may reduce the manufacturing cost by simplifying the package structure.

The method for manufacturing the light emitting element package according to the embodiments does not require the separate package substrate The method for manufacturing the light emitting element package according to the embodiments may manufacture the plurality of light emitting element packages at once.

The method for manufacturing the light emitting element package according to the embodiments may freely adjust the spacing between the plurality of light emitting element packages.

The method for manufacturing the light emitting element package according to the embodiments may easily manufacture the LED display device.

Furthermore, in accordance with embodiments, there are additional technical effects not mentioned herein, and a person skilled in the art may understand this through the entire purpose of the present document and the drawings.

DETAILED DESCRIPTION

Figure 1:
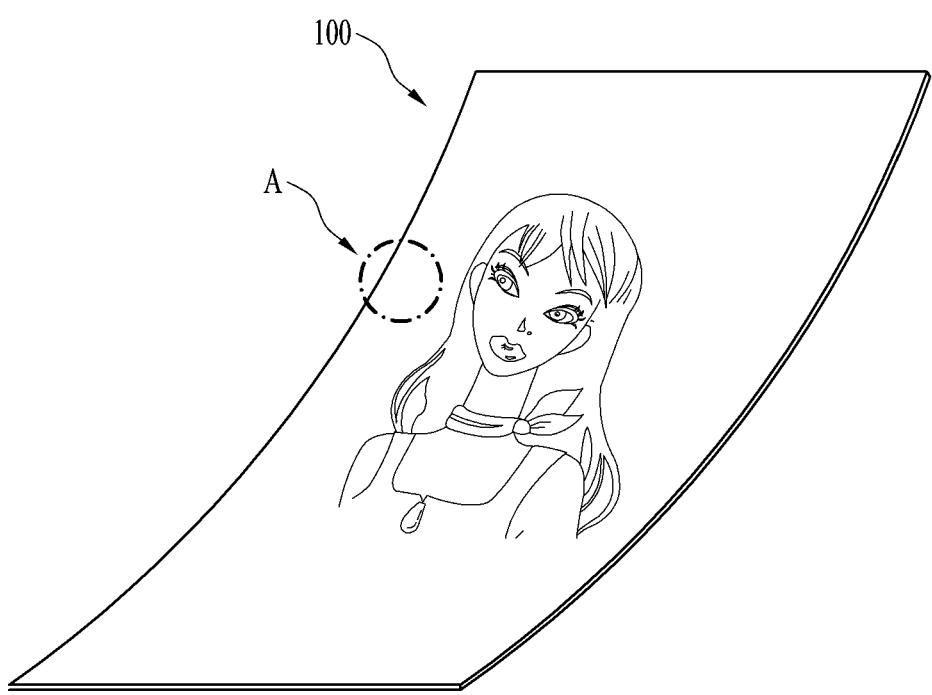
FIG. 1 is a conceptual diagram illustrating a display device using a light emitting element according to embodiments.

Reference will now be made in detail to embodiments of the present disclosure, examples of which are illustrated in the accompanying drawings. Wherever possible, the same reference numbers will be used throughout the drawings to refer to the same or like parts, and a redundant description thereof will be omitted. In addition, it should be noted that the accompanying drawings are only for easy understanding of the embodiments disclosed in the present specification, and should not be construed as limiting the technical spirit disclosed in the present specification.

In addition, when an element such as a layer, a region, or a substrate is described as being "on" another element, it is to be understood that the element may be directly on the other element, or there may be an intermediate element between them.

Terms such as first, second, and the like may be used to describe various components of embodiments. However, interpretation of various components according to the embodiments should not be limited by the above terms. Such terms are merely used to distinguish one component from another. For example, a first user input signal may be referred to as a second user input signal. Similarly, the second user input signal may be referred to as the first user input signal. Use of such terms should be interpreted as not departing from the scope of the various embodiments. The first user input signal and the second user input signal are both user input signals, but do not mean the same user input signal unless clearly indicated in the context.

Terms used to describe the embodiments are for the purpose of describing the specific embodiments and are not intended to limit the embodiments. As used in the description of the embodiments and claims, the singular form is intended to include the plural form unless the context clearly dictates otherwise. The expression 'and/or' is used in a sense that includes all possible combinations between the terms. The expression 'include' describes the presence of features, numbers, steps, elements, and/or components and does not imply the absence of additional features, numbers, steps, elements, and/or components. Conditional expressions such as 'in case of ~', 'when ~', and the like used to describe the embodiments are not limited to optional cases. It is intended that when a specific condition is satisfied, a relevant action is performed or a relevant definition is interpreted in response to the specific condition.

Furthermore, although the drawings are separately described for simplicity, embodiments implemented by combining two or more drawings are also within the scope of the present disclosure.

In addition, when an element such as a layer, a region, or a substrate is described as being "on" another element, it is to be understood that the element may be directly on the other element, or there may be an intermediate element between them.

The display device described herein conceptually includes all display devices that display information with a unit pixel or a set of unit pixels. Therefore, the term "display device" may be applied not only to finished products but also to parts. For example, a panel corresponding to a part of a digital TV also independently corresponds to the display device in the present specification. Such finished products include a mobile phone, a smartphone, a laptop computer, a digital broadcasting terminal, a personal digital assistant (PDA), a portable multimedia player (PMP), a navigation system, a slate PC, a tablet PC, an Ultrabook, a digital TV, a desktop computer, and the like.

However, it will be readily apparent to those skilled in the art that the configuration according to the embodiments described herein is also applicable to new products to be developed later as display devices.

In addition, the term "semiconductor light-emitting element" mentioned in this specification conceptually includes an LED, a micro LED, and the like, and may be used interchangeably therewith.

A light emitting element package described through the embodiments includes a light emitting element and a driver that drives the light emitting element. Additionally, the light emitting element package may be used as a meaning including one or more light emitting elements. Additionally, the light emitting element package may be used interchangeably with a light source. In this regard, the light source includes one light emitting element and the driver that drives the light emitting element.

FIG. 1 is a conceptual diagram illustrating a display device using a light emitting element according to embodiments.

As illustrated in FIG. 1, information processed by a controller (not shown) of a display device 1000 may be displayed using a flexible display.

The flexible display includes, for example, a display that is flexible, bendable, twistable, foldable, or rollable by an external force.

Further, the flexible display may be, for example, a display manufactured on a thin flexible substrate that is flexible, bendable, twistable, foldable, or rollable, such as paper. while maintaining display characteristics of an existing flat panel display.

In a state in which the flexible display is not bent (e.g., a state of having an infinite radius of curvature, hereinafter referred to as, a first state), a display area of the flexible display is flat. In a state in which the flexible display is bent by the external force from the first state (e.g., a state of having a finite radius of curvature, hereinafter, referred to as, a second state). the display area may be curved.

As shown in FIG. 1, information displayed in the second state may be visual information output on the curved surface. Such visual information is implemented as light emission of each of unit pixels (sub-pixels) arranged in a matrix form is independently controlled. The unit pixel means, for example, a minimum unit for rendering one color.

The unit pixel of the flexible display may be implemented by a semiconductor light emitting element. The present disclosure illustrates a light emitting diode (LED) as one type of semiconductor light emitting element that converts a current into light. The light emitting diode is formed to have a small size, thereby serving as the unit pixel even in the second state.

Hereinafter, a light emitting element package used in the display device 1000 will be described in detail by enlarging A.

Figure 2:
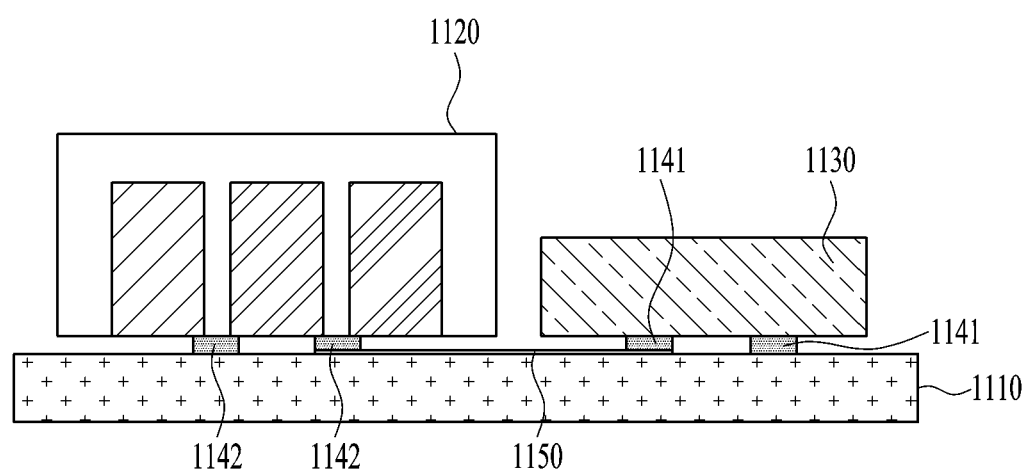
FIG. 2 is a schematic cross-sectional view of a light emitting element package according to embodiments.

FIG. 2 is a schematic cross-sectional view of a light emitting element package according to embodiments.

A light emitting element package 1100 according to embodiments may include a substrate 1110 on which a plurality of first pads 1141 and a plurality of second pads 1142 are formed, and a light emitting element 1120 and a driver 1130 disposed in parallel with each other on the substrate 1110.

The light emitting element 1120 according to embodiments may be electrically connected to at least one of the plurality of second pads 1142. The driver 1130 may be electrically connected to at least one of the plurality of first pads 1141. In this regard. at least some of the plurality of first pads 1141 and at least some of the plurality of second pads 1142 may be electrically connected to each other via an electrical wiring 1150. That is, the light emitting element 1120 and the driver 1130 may be electrically connected to each other via the substrate 1110.

The substrate 1110 according to embodiments may have an electrode pattern corresponding to the light emitting element 1120. That is, the light emitting element 1120 may be mounted on the substrate 1110. The substrate 1110 according to embodiments may be a substrate including a printed circuit that applies an electrical signal to the light emitting element 1120. Alternatively, although not shown in FIG. 10, the separate printed circuit board may be disposed under the substrate 1110.

The driver 1130 according to embodiments may control the light emitting element 1120, and may control, for example, ON/OFF of the light emitting element 1120.

Figure 10:
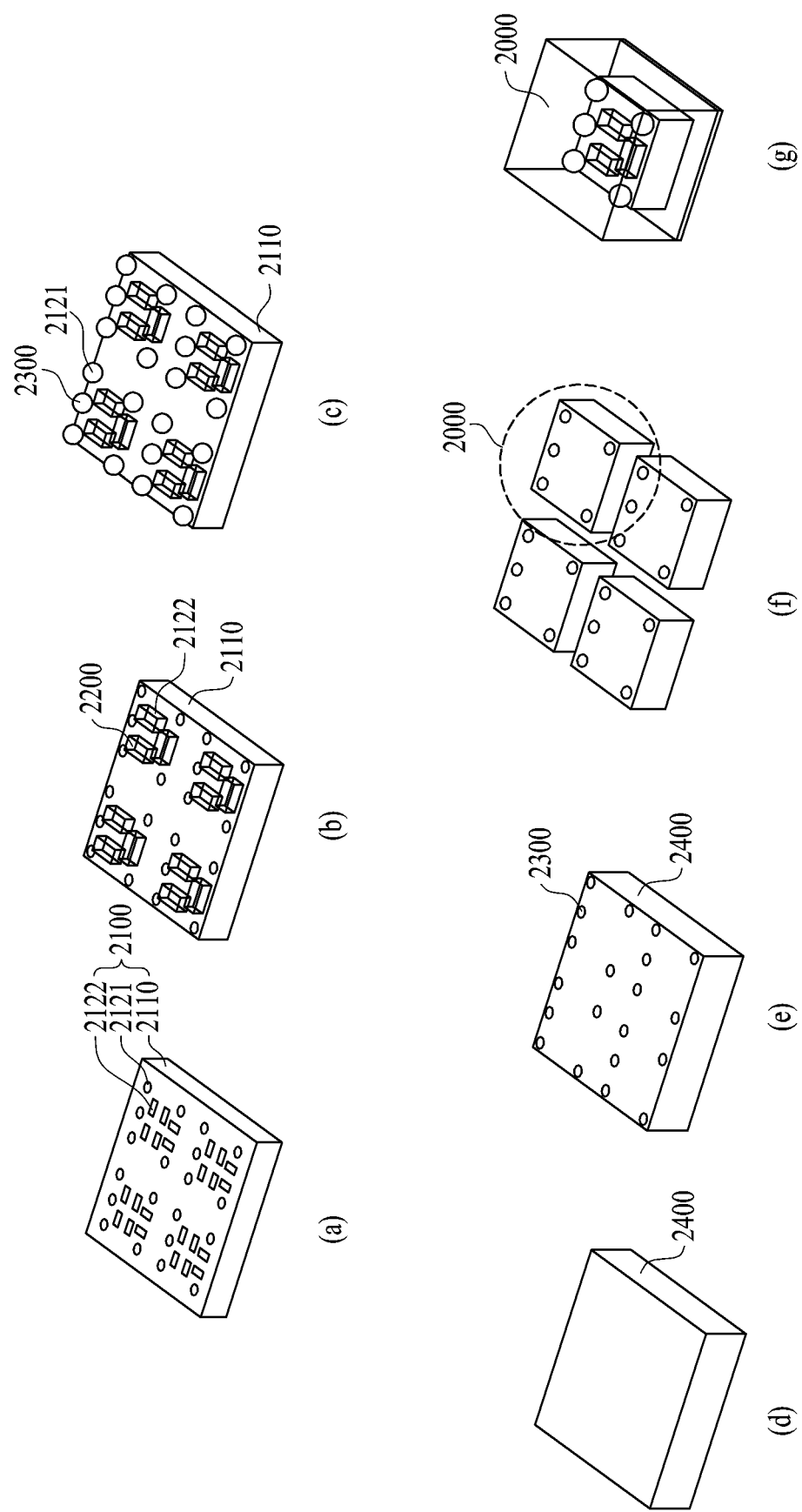
FIG. 10 is a schematic view of a method for manufacturing a light emitting element package described with reference to FIG. 9.

The driver 1130 according to embodiments may be. for example, a driver IC. FIG. 10 illustrates an example in which one driver 1130 controls one light emitting element 1120 in one light emitting element package 1100, but the number of drivers 1130 is not limited thereto. For example, one driver 1130 may simultaneously or sequentially control the plurality of light emitting elements 1120, or the plurality of drivers 1130 may simultaneously or sequentially control one or plurality of light emitting elements 1120.

The light emitting element package 1100 including the substrate 1110 according to embodiments may be formed using a wire bonding or a flip process. However, in the light emitting element package 1100 including the substrate 1110 according to embodiments, as the driver 1130 and the light emitting element 1120 are arranged in a horizontal direction, securing of an area size equal to or greater than a predetermined area size was required. That is, because it is difficult to reduce a size of the light emitting element package 1000 to a certain level or more, it was also difficult to reduce a size of a bezel to a certain level or more. To solve such problem, there has been attempts to form the light emitting element package 1100 using a through silicon via (TSV) method, but in this case, an excessive cost occurred during the TSV process.

Therefore, hereinafter, a method for reducing the size of the light emitting element package without the excessive cost will be described in detail.

Figure 3:
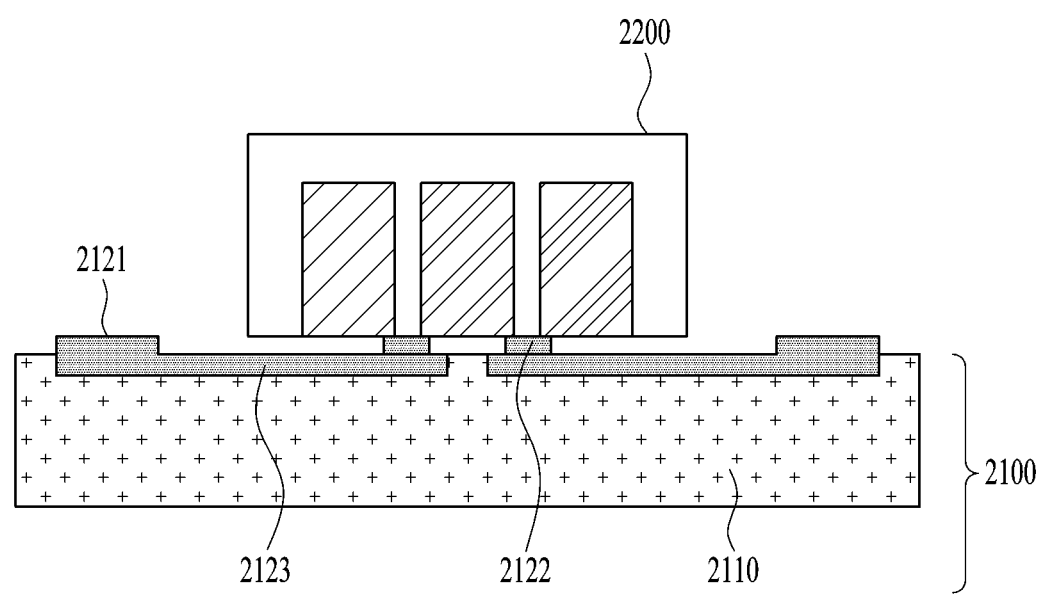
FIG. 3 is a schematic cross-sectional view of a light emitting element package according to embodiments.

FIG. 3 is a schematic cross-sectional view of a light emitting element package according to embodiments.

A light emitting element package 2000 according to embodiments may include a driver 2100 and a light emitting element 2200 (e.g., the light emitting element described with reference to FIGS. 1 to 2) formed on the driver 2100 to be perpendicular to the driver 2100.

The light emitting element package 2000 may include the driver 2100 and the light emitting element 2200 that are positioned perpendicular to each other. That is, the light emitting element package 2000 according to embodiments may include the driver 2100 and the light emitting element 2200 integrated with each other.

The driver 2100 according to embodiments may control the light emitting element 2200, and may control. for example. ON/OFF of the light emitting element 2200.

The driver 2100 according to embodiments may be, for example, a driver IC. FIG. 3 illustrates an example in which one driver 2100 controls one light emitting element 2200 in one light emitting element package 2000, but the number of the drivers 2100 is not limited thereto. For example, one driver 2100 may simultaneously or sequentially control the plurality of light emitting elements 2200, or the plurality of drivers 2100 may simultaneously or sequentially control one or plurality of light emitting elements 2200.

The driver 2100 according to embodiments may include a substrate 2110 having a first pad 2121 and a second pad 2122 formed on one surface thereof. Alternatively. the driver 2100 may include the substrate 2110 on which an electrical wiring 2123 connecting the first pad 2121 and the second pad 2122 to each other is formed on one surface thereof.

The first pad 2121 according to embodiments may be an electrode that allows an external circuit and the driver 2100 to be electrically connected to each other. The second pad 2122 may be an electrode that allows the driver 2100 and the light emitting element 2200 to be electrically connected to each other. The first pad 2121 and the second pad 2122 may be electrically connected to each other by the electrical wiring 2123 (e.g. the electrical wiring described in FIG. 2) formed on one surface of the driver 2100.

At least one of the first pad 2121, the second pad 2122, and the electrical wiring 2133 may be. for example, a metal including at least one of Cu, Ag, Al, Ni, Ti, Cr, Pd, Au, and Sn. However, the present disclosure may not be limited thereto, and at least one of the first pad 2121, the second pad 2122, and the electrical wiring 2123 may be any conductor. In addition, for convenience of description, the electrical wiring 2123 is simply illustrated in FIG. 3, but the present disclosure is not limited thereto. The number or a shape of the electrical wirings 2123 for electrically connecting the first pad 2121 and the second pad 2122 to each other are not limited.

FIG. 3 illustrates the cross-sectional view. Although not shown in detail in FIG. 3, the driver 2100 may include one or more first pads 2121 and one or more second pads 2122. That is, the numbers thereof for electrically connecting the driver 2100, the light emitting element 2200, and/or the external device (not shown) to each other are not limited.

The light emitting element 2200 according to embodiments may be disposed on one surface of the driver 2100, and for example, the light emitting element 2200 may be disposed perpendicular to the driver 2100. Specifically, the light emitting element 2200 may be disposed on the second pad 2122. The light emitting element 2200 may be electrically connected to the second pad 2122. In this regard, the light emitting element 2200 may be, for example, a semiconductor light emitting element that emits light in red (R), green (G), and blue (B) colors.

In FIG. 3, it is illustrated that the driver 2100 has a larger cross-sectional area than the light emitting element 2200 in a top view, but the present disclosure is not limited thereto. Unlike as shown in FIG. 3, in the top view, the cross-sectional area of the driver 2100 may be equal to the cross-sectional area of the light emitting element 2200. The light emitting element package 2000 may reduce a size of one pixel by positioning the light emitting element 2200 on top of the driver 2100.

In addition, the light emitting element package 2000 may not require a separate package substrate by disposing the light emitting element 2200 on top of the driver 2100. The light emitting element package 2000 may be implemented without a separate wafer process. That is, the light emitting element package 2000 may be implemented without a separate process (e.g., an IC flip process) for mounting the driver such as the driver IC on the package substrate.

Hereinafter, the light emitting element package 2000 according to embodiments further including a bonding portion for electrical connection with an external substrate, a device, or a display module will be described in detail.

Figure 4:
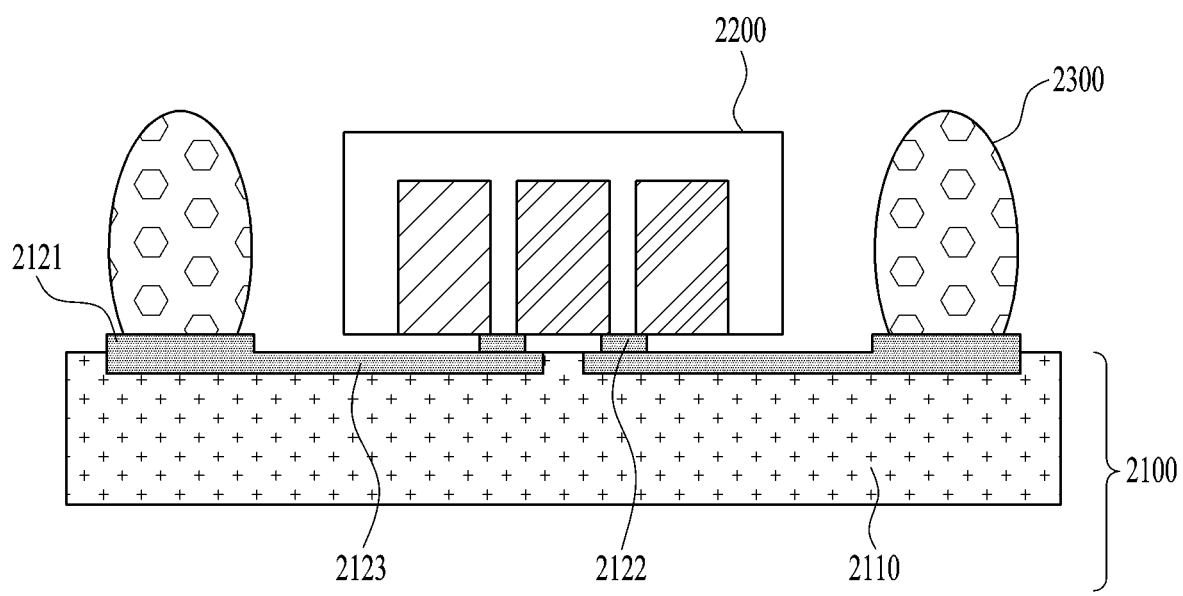
FIG. 4 is a schematic cross-sectional view of a light emitting element package according to embodiments.

FIG. 4 is a schematic cross-sectional view of a light emitting element package according to embodiments.

The light emitting element package 2000 according to embodiments may include the driver 2100, the light emitting element 2200 formed on top of the driver 2100 to be perpendicular to the driver 2100, and a bonding portion 2300 disposed on the driver 2100 in parallel with the light emitting element 2200.

The light emitting element package 2000 may include one or more bonding portions 2300 disposed on the first pad 2121 to be electrically connected to the first pad 2121, and the light emitting element disposed on the second pad 2122 to be electrically connected to the second pad 2122.

That is, the light emitting element package 2000 may include the electrical wiring 2123 printed on one surface of the driver 2100, the first pad 2121 and the second pad 2122 connected to each other by the electrical wiring 2123 and positioned on the electrical wiring 2123, the bonding portion 2300 disposed on the first pad 2123, and the light emitting element 2200 disposed on the second pad 13122.

The light emitting element package 2000 according to another embodiment may be implemented without a separate via for connecting the bonding portion 2300, the driver 2100, and the light emitting element 2200 to each other by positioning the light emitting element 2200 and the bonding portion 2300 on one surface of the driver 2100. Accordingly, even without the separate process for forming the via, for example, the TSV process, the electrical connection between the bonding portion 2300, the driver 2100, and the light emitting element 2200 may be achieved. Accordingly. the light emitting element package 2000 according to embodiments may include the driver 2100 that may be more easily designed.

The bonding portion 2300 according to embodiments may further easily adhere the external circuit to the driver 2100. The bonding portion 2300 may be formed to have a vertical dimension equal to or greater than that of the light emitting element 2200.

The bonding portion 2300 may include, for example, at least one of a solder bump, a solder ball, a copper bump, and a solder paste. However, the present disclosure may not be limited thereto, and the bonding portion 2300 may be any material that is adhesive and conductive.

Hereinafter, a method for manufacturing the light emitting element package 2000 according to embodiments will be described in detail.

Figure 5:
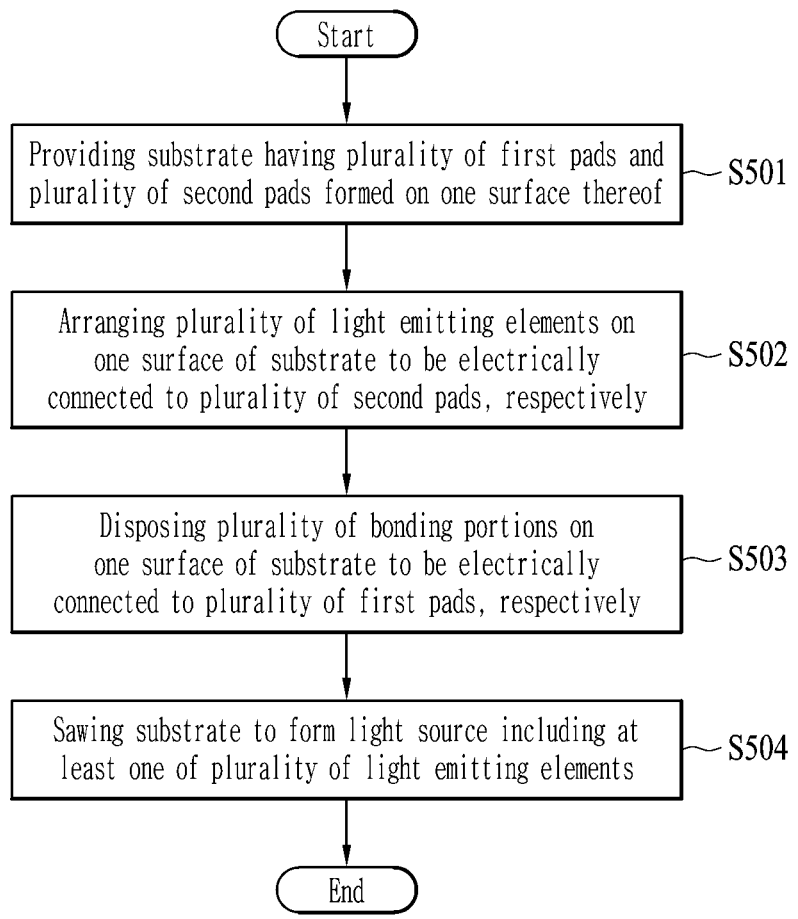
FIG. 5 is a flowchart of a method for manufacturing a light emitting element package according to embodiments.

FIG. 5 is a flowchart of a method for manufacturing a light emitting element package according to embodiments.

Figure 6:
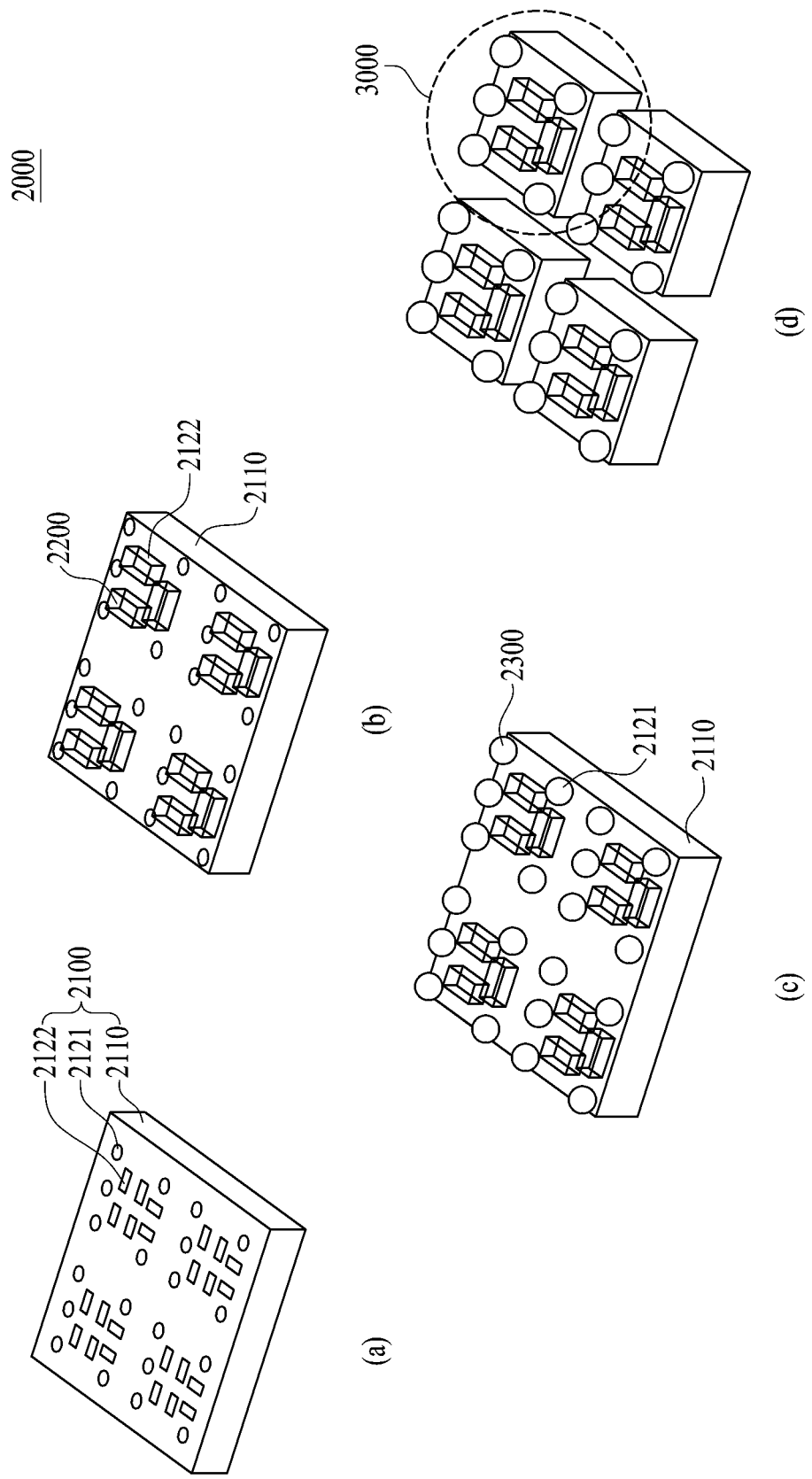
FIG. 6 is a schematic view of a method for manufacturing a light emitting element package in FIG. 5.

FIG. 6 is a schematic view of a method for manufacturing a light emitting element package in FIGS. 5.

s501 to s504 in FIG. 5 and (a), (b), (c), and (d) in FIG. 6 sequentially illustrate the method for manufacturing the light emitting element package 2000.

As shown in FIG. 5 and (a) in FIG. 6, the method for manufacturing the light emitting element package 2000 according to embodiments may include providing the substrate 2110 having the plurality of first pads 2121 and the plurality of second pads 2122 formed on one surface thereof (s501).

The substrate 2110 according to embodiments may include, for example, a wafer, and may include, for example, a silicon wafer. The substrate 2110 may be, for example, a semiconductor wafer on which a semiconductor element is formed.

Although not shown in (a) in FIG. 6, to electrically connect the first pad 2121 and the second pad 2122 to each other, the electrical wiring described with reference to FIGS. 2 to 4 may be further disposed on the substrate 2110.

Although not shown in FIG. 5 and (a) in FIG. 6, the method for manufacturing the light emitting element package 2000 may further include performing a protective coating on the other surface of the substrate 2110 on which the first pad 2121 and the second pad 2122 are not formed. That is, the method for manufacturing the light emitting element package 2000 may further include performing the protective coating on the other surface of the driver 2100.

By performing the protective coating on the other surface of the driver 2100. the substrate 2110 may be prevented from being easily broken. In addition, by performing the protective coating on the other surface of the driver 2100, a substrate that is not broken, shattered, and/or deformed even when polishing is performed as necessary may be provided.

As shown in FIG. 5 and (b) in FIG. 6, the method for manufacturing the light emitting element package 2000 according to embodiments may include arranging the plurality of light emitting elements 2200 on one surface of the substrate 2110 to be electrically connected to the plurality of second pads 2122, respectively (s502).

The light emitting element 2200 according to embodiments may include an LED chip including at least one of red, green, and blue LEDs. As shown in (b) in FIG. 6. the light emitting element 2200 may be a stacked light emitting element in which the red, green, and blue LEDs are stacked. In this case, the light emitting element package 2000 may further reduce a size of a cross-sectional area. However, unlike as shown in (b) in FIG. 6. the light emitting element 2200 may be an individual light emitting element in which at least one of the red, green, and blue LEDs are individually disposed. In this case, the light emitting element package 2000 may render a high-brightness color.

As shown in FIG. 5 and (c) in FIG. 6, the method for manufacturing the light emitting element package 2000 according to embodiments may include disposing the plurality of bonding portions 2300 on one surface of the substrate 2110 to be electrically connected to the plurality of first pads 2121, respectively (s503). However, operations s502 and s503 may be changed in order. That is, after the bonding portion 2300 is first disposed on the driver 2100, the light emitting element 2200 may be disposed.

The light emitting element package 2000 according to embodiments may be bonded to and electrically connected to the external substrate or the external device via the bonding portion 2300. As described with reference to FIG. 4, the bonding portion 2300 may include, for example, at least one of the solder bump, the solder ball, the copper bump, and the solder paste. However, the present disclosure may not be limited thereto, and the bonding portion 2300 may be any material that is adhesive and conductive.

Like the light emitting element package 2000 described with reference to FIG. 3. operation s503 may be omitted. When operation s503 is omitted, the light emitting element package 2000 may be electrically connected to the external substrate or the external device via a printing process.

As shown in FIG. 5 and (d) in FIG. 6, the method for manufacturing the light emitting element package 2000 according to embodiments may include sawing the substrate 2110 to form a light source 3000 including at least one of the plurality of light emitting elements 2300 (s504). Via the sawing according to embodiments, the light emitting element package 2000 described with reference to FIGS. 3 to 4 may be formed.

The sawing may be performed in units of one light emitting element 2300. In this case, the light source 3000 may have the same meaning as the light emitting element package 2000. That is, the plurality of light emitting element packages 2000 or the single light source 3000 may be formed via the sawing.

Alternatively, although not shown in (d) in FIG. 6. the sawing may be performed in units of the plurality of light emitting elements 2300. In this case, one light emitting element package 2000 may include the plurality of light sources 3000. In this case, the light emitting element package 2000 may be manufactured to include the plurality of light sources 3000 based on a desired size or performance.

Hereinafter, various embodiments of a method for manufacturing the light emitting element package 2000 according to embodiments will be described in detail with reference to FIGS. 7 to 14.

Figure 7:
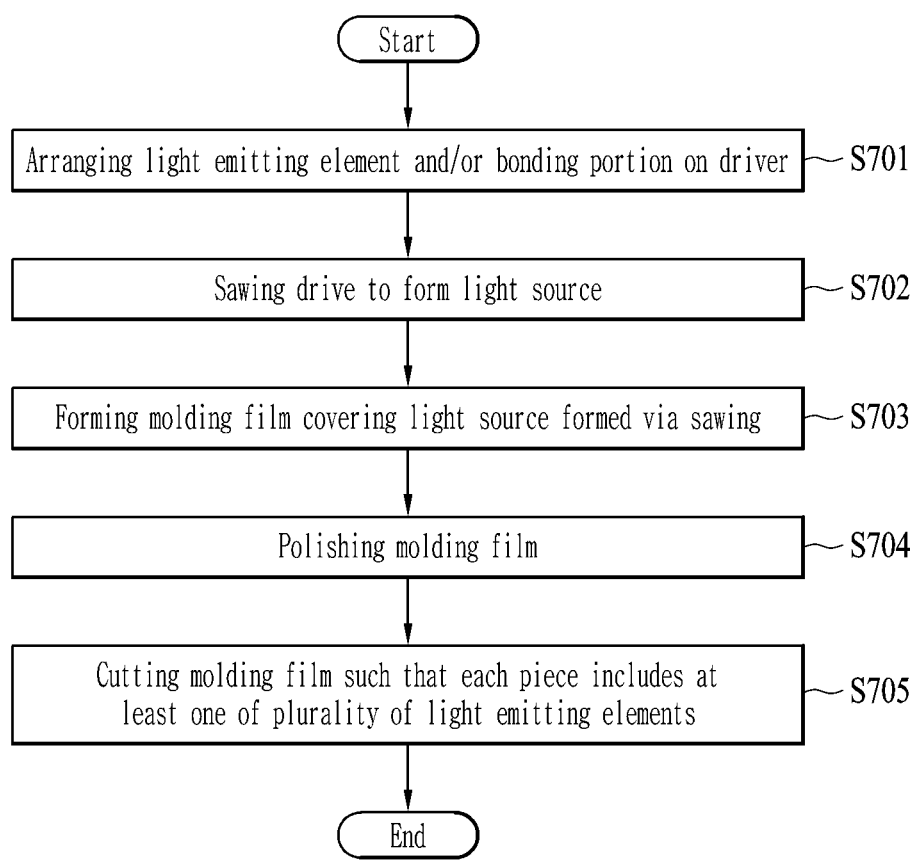
FIG. 7 is a flowchart of a method for manufacturing a light emitting element package according to embodiments.

FIG. 7 is a flowchart of a method for manufacturing a light emitting element package according to embodiments.

Figure 8:
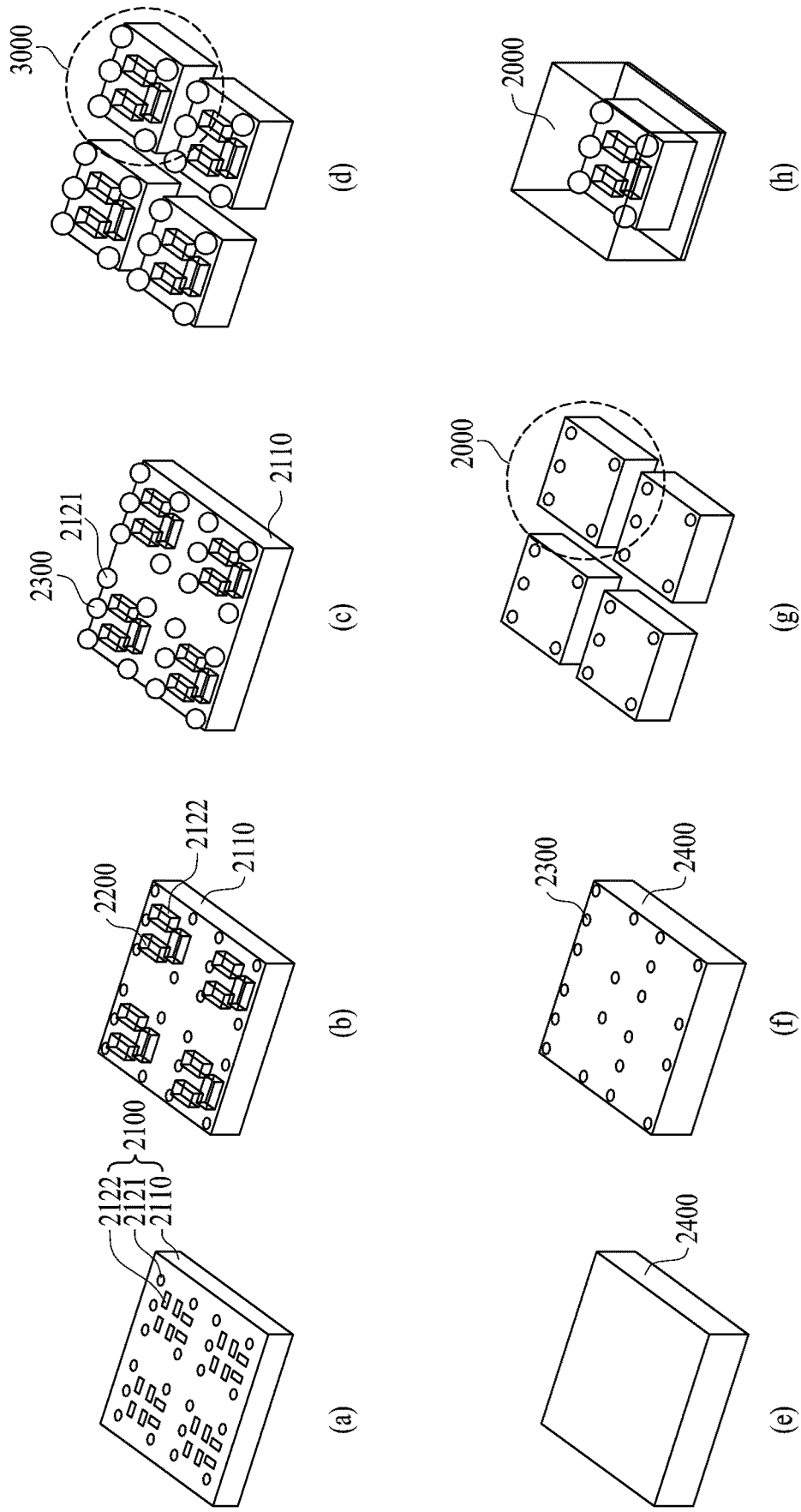
FIG. 8 is a schematic view of a method for manufacturing a light emitting element package in FIG. 7.

FIG. 8 is a schematic view of a method for manufacturing a light emitting element package in FIGS. 7.

s701 to s705 in FIG. 7 and (a) to (h) in FIG. 8 sequentially illustrate the method for manufacturing the light emitting element package 2000.

As shown in FIG. 7 and (a) to (c) in FIG. 8, the method for manufacturing the light emitting element package 2000 according to embodiments includes arranging the light emitting element 2300 and/or the bonding portion 2200 on the driver 2100 (s701). Detailed contents of s701 are the same as or similar to s501 to s503 in FIG. 5 and (a) to (c) in FIG. 6. and thus will be omitted.

As shown in FIG. 7 and (d) in FIG. 8, the method for manufacturing the light emitting element package 2000 according to embodiments may include sawing the substrate 2110 to form the light source 3000 including at least one of the plurality of light emitting elements 2300 (s702). Detailed contents of s702 are the same as or similar to s504 in FIG. 5 and (d) in FIG. 6, and thus will be omitted.

The plurality of sawed light sources 3000 may be arranged at a predetermined spacing or may be arranged to have a desired spacing. That is, the spacing between the plurality of light sources 3000 may be uniform or may be non-uniform when necessary.

As the sawing is performed before operation s703, the plurality of light sources 3000 may be arranged at the desired spacing when a molding film is formed via s703. In addition, as an area of the driver 2100 that is cut by performing the sawing after the package is completed is minimized, a loss rate of the driver 2100 may be reduced.

As shown in FIG. 7 and (e) in FIG. 8, the method for manufacturing the light emitting element package 2000 according to embodiments includes forming a molding film 2400 covering the one or more light sources 3000 formed via the sawing (s703).

The molding film 2400 according to embodiments may be formed by applying a molding resin to the one or more light sources 3000. Alternatively, the molding film 2400 may be formed in a form of attaching a film. Alternatively, the molding film 2400 may be formed via deposition such as sputtering.

The molding film 2400 may be formed only on a top surface of the light source 3000 such that a side surface of the light source 3000 is exposed to the outside. Alternatively, the molding film 2400 may be formed on both the top surface and the side surface of the light source 3000 to protect the light source 3000 from the outside. Further, the molding film 2400 may be formed on entire surfaces of the light source 3000 or the entire surfaces of the light source 3000 excluding a portion of the light source 3000. The molding film 2400 may be formed to protect a portion of the light source 3000 requiring protection and open a portion of the light source 3000 that needs to be connected to or exposed to the outside.

The molding film 2400 may be made of, for example, an epoxy molding compound (EMC) or the like, and may be made of. for example, a material in which an epoxy resin and silica are mixed with each other, but the present disclosure may not be limited thereto. The molding film 2400 may be made of any material that is able to protect the light source from the outside, is insulating, or is able to prevent deterioration.

As molding is performed on the sawed light sources 3000, the plurality of light sources may be fixed at the spacing at which the plurality of light sources are arranged. Accordingly, when the plurality of light sources need to be moved, transferred, or arranged as in. for example, a mounting process and a pick-and-place process, the movement, the transfer, or the arrangement may be performed at once.

Although not shown in (e) in FIG. 8, the molding film may include two or more layers. For example, the molding film may include a first layer and a second layer formed on the first layer, and the first layer and the second layer may be made of different materials. In this case, the second layer may have a film form, and may further contain, for example, a curing agent and/or a material having an adhesive component. Accordingly, the molding film may better protect the light source from the outside.

The molding film 2400 may prevent the light source 3000 from being deteriorated from the outside.

Referring to FIG. 7 and (f) in FIG. 8, polishing the molding film 2400 (s704) may be included.

The polishing according to embodiments may be performed by polishing at least a portion or one surface of the molding film 2400. The polishing may be performed such that at least a portion of the bonding portion 2300 covered by the molding film 2400 is exposed with respect to at least the portion or the one surface of the molding film 2400. Although not shown in FIG. 8, in the case of the light source 3000 formed by omitting the bonding portion 2300, the polishing may be performed such that the wiring or the pad formed in the light source 3000 is exposed to the outside.

Accordingly, the light emitting element package 2000 may be electrically connected to the outside. For example, the exposed bonding portion 2300 and an external wiring electrode (not shown) may be electrically connected to each other to supply power to the light emitting element package 2000.

(g) in FIG. 8 illustrates that the molding film 2400 is cut such that each piece includes one or more light sources 3000 to form the light emitting element package 2000 as necessary.

(h) in FIG. 8 illustrates the light emitting element package 2000 manufactured via FIG. 7 and (a) to (g) in FIG. 8.

The light emitting element package 2000 formed via the embodiments described with reference to FIGS. 7 and 8, as a light emitting element package in which the driver 2100 and the light emitting unit 2200 are integrated with each other, may be individually and easily repaired. In addition, because the light emitting element package 2000 has a simple structure without requiring a separate substrate for the package, a manufacturing process cost may be reduced.

As shown in FIGS. 7 and 8, in the method for manufacturing the light emitting element package according to embodiments, the plurality of light emitting element packages 2000 may be formed at once. In addition, the light emitting element package 2000 having the desired size, shape, and performance may be formed via the sawing.

Figure 9:
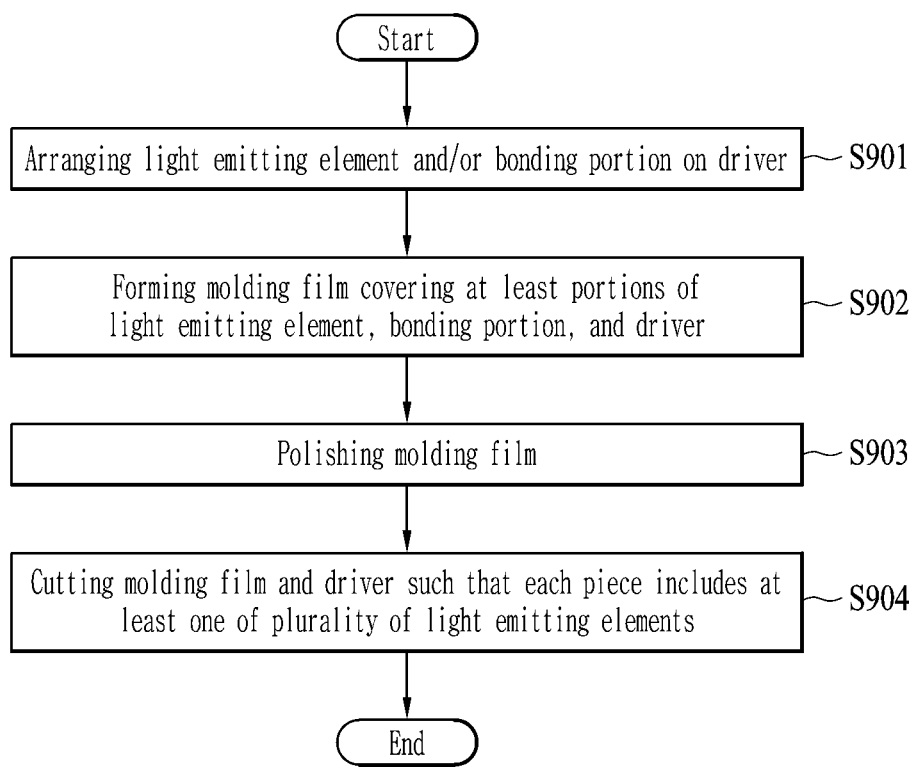
FIG. 9 is a flowchart of a method for manufacturing a light emitting element package according to embodiments.

FIGS. 9 and 10 illustrate another embodiment of manufacturing a light emitting element package according to embodiments.

FIG. 9 is a flowchart of a method for manufacturing a light emitting element package according to embodiments.

FIG. 10 is a schematic view of a method for manufacturing a light emitting element package described with reference to FIGS. 9.

s901 to s904 in FIG. 9 and (a) to (g) in FIG. 10 sequentially illustrate the method for manufacturing the light emitting element package 2000.

As shown in FIG. 9 and (a) to (c) in FIG. 10, the method for manufacturing the light emitting element package 2000 according to embodiments includes arranging the light emitting element 2300 and/or the bonding portion 2200 on the driver 2100 (s901). Detailed contents of s901 are the same as or similar to s501 to s503 in FIG. 5 and (a) to (c) in FIG. 6, and thus will be omitted.

As shown in FIG. 9 and (d) in FIG. 10, the method for manufacturing the light emitting element package 2000 according to embodiments includes forming the molding film 2400 covering at least a portion of at least one of the light emitting element 2200, the bonding portion 2300, and the driver 2100 (s902). Detailed contents of s902 are the same as or similar to s703 in FIG. 7 and (e) in FIG. 8, and thus will be omitted.

As shown in FIG. 9 and (e) in FIG. 10, the method for manufacturing the light emitting element package 2000 according to embodiments includes polishing the molding film 2400 such that at least a portion of the bonding portion 2300 is exposed (s903). Detailed contents of s903 are the same as or similar to s704 in FIG. 7 and (f) in FIG. 8, and thus will be omitted.

As shown in FIG. 9 and (f) in FIG. 10, the method for manufacturing the light emitting element package 2000 according to embodiments includes cutting the molding film 2400 and the driver 2100 such that each piece includes at least one of the plurality of light emitting elements 2300 (s904). Accordingly, the light emitting element package 2000 may be formed as necessary.

(g) in FIG. 10 illustrates the light emitting element package 2000 manufactured via FIG. 9 and (a) to (f) in FIG. 10.

The light emitting element package 2000 formed via the embodiments described with reference to FIGS. 9 and 10, as a light emitting element package in which the driver 2100 and the light emitting unit 2200 are integrated with each other, may be individually and easily repaired. In addition, because the light emitting element package 2000 has a simple structure without requiring a separate substrate for the package. the manufacturing process cost may be reduced. In addition, by performing the sawing only once, the process of manufacturing the light emitting element package 2000 may be more simplified, thereby further reducing the cost.

As shown in FIGS. 9 and 10, in the method for manufacturing the light emitting element package according to embodiments, the plurality of light emitting element packages 2000 may be formed at once. In addition, the light emitting element package 2000 having the desired size, shape, and performance may be formed via the sawing.

Figure 11:
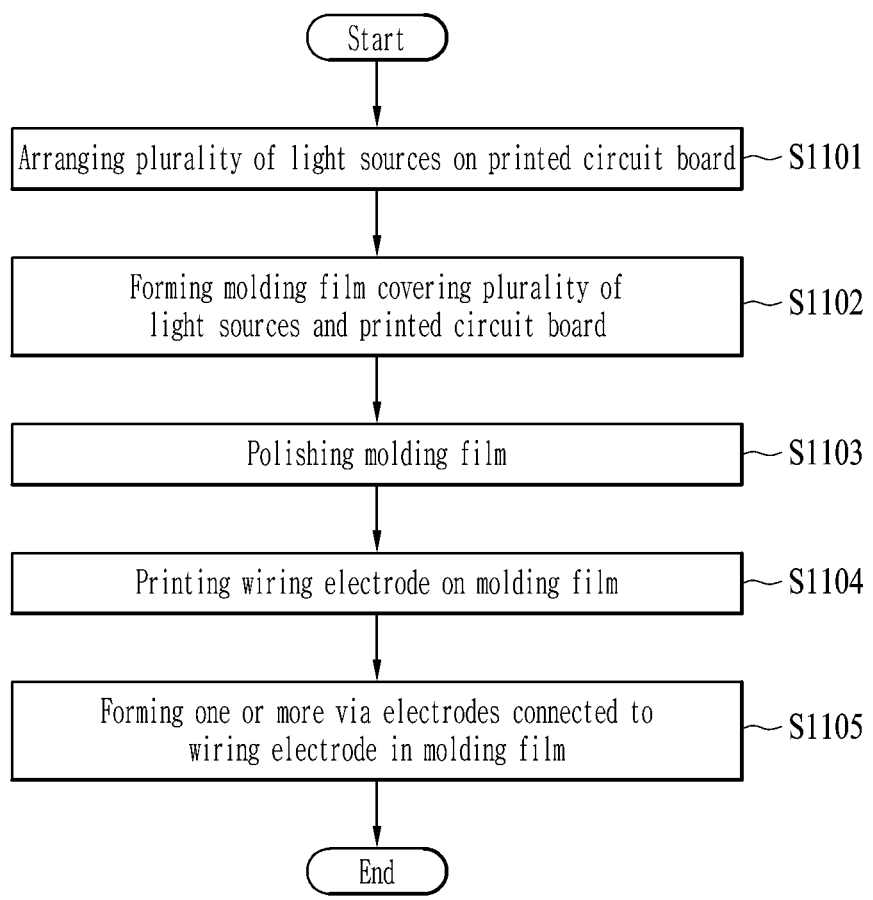
FIG. 11 is a flowchart of a method for manufacturing a display module according to embodiments.
Figure 12:
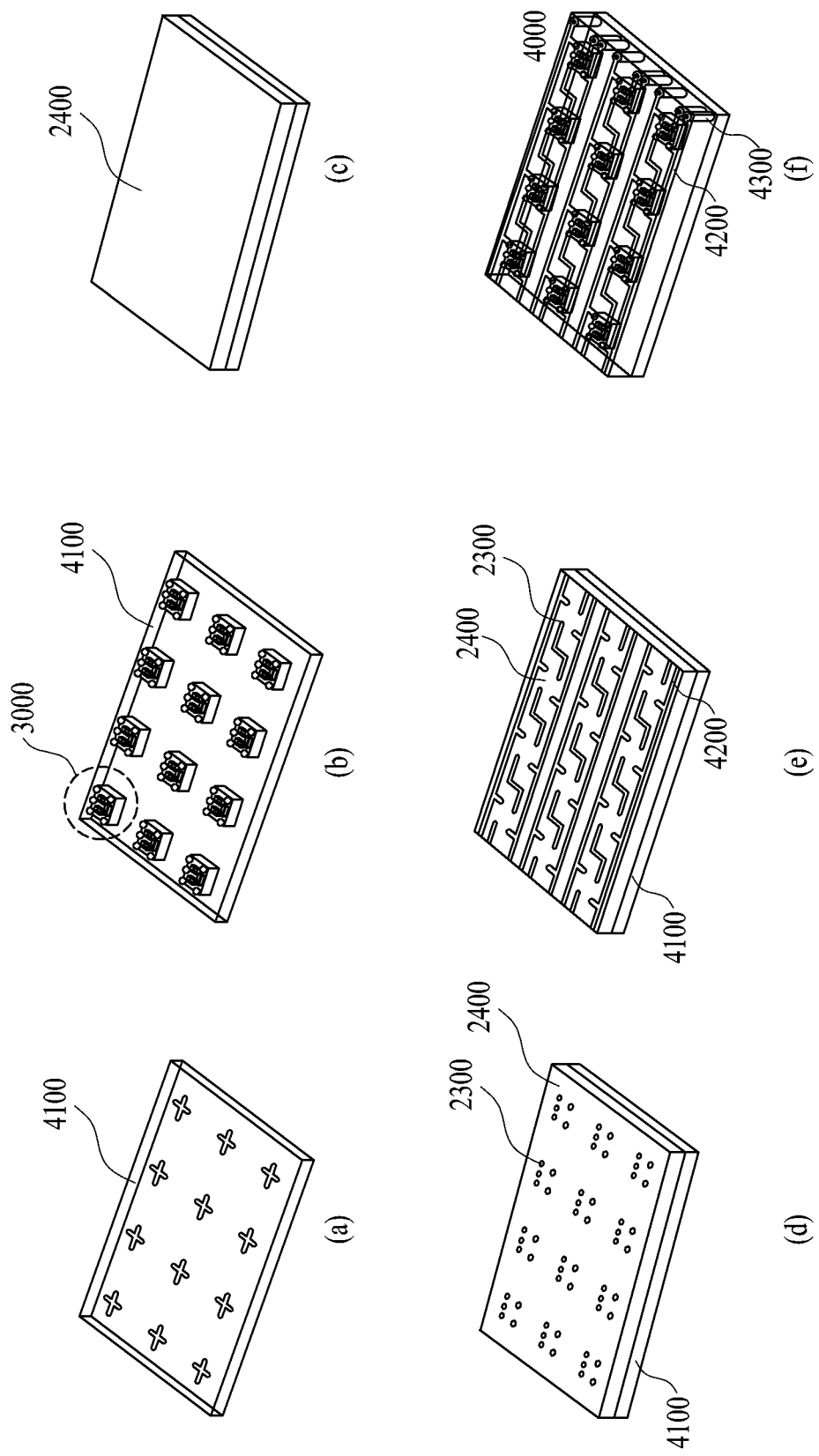
FIG. 12 is a schematic view of a method for manufacturing a display module described with reference to FIG. 11.

FIGS. 11 and 12 illustrate an embodiment of manufacturing a display device according to embodiments using the light emitting element packages described via the examples in FIGS. 3 to 10.

FIG. 11 is a flowchart of a method for manufacturing a display module according to embodiments.

FIG. 12 is a schematic view of a method for manufacturing a display module described with reference to FIG. 11.

Although 4000 is described as the display module in FIGS. 11 and 12 for convenience of description, the display module may be included in or equal to the display device, so that the terms 'display module' and 'display device' may be used interchangeably. That is, the display device 1000 described in FIG. 1 may be the same as the display module 4000 described in FIGS. 11 and 12. Alternatively, the display device 1000 described in FIG. 1 may include a plurality of display modules 4000 described in FIGS. 11 and 12.

s1101 to s1105 in FIG. 11 and (a) to (f) in FIG. 12 sequentially illustrate the method for manufacturing the display module 4000.

As shown in FIG. 11 and (a) and (b) in FIG. 12, the method for manufacturing the display module 4000 according to embodiments includes providing a base including the plurality of light sources 3000 including the respective bonding portions 2300 (s1101).

Specifically, the providing of the base may include arranging the plurality of light sources 3000 including the respective bonding portions 2300 on one surface of a printed circuit board (PCB). That is. the base may be, for example, the printed circuit board, and both terms may be used interchangeably in description of FIGS. 11 and 12.

The light source 3000 according to embodiments may include the light emitting element package 2000 described with reference to FIGS. 3 to 4. Alternatively, the light source 3000 described with reference to FIGS. 5 to 6 may be included. Alternatively, the light source 3000 described with reference to s702 in FIG. 7 and (d) in FIG. 8 may be included. That is, the light source 3000 may include the driver 2100 and the light emitting element 2200 formed perpendicular to the driver 2100, and may further include the bonding portion 2300 formed on the driver 2100 to be parallel to the light emitting element 2200.

When one light emitting element package 2000 is cut in units of the plurality of light sources 3000, the embodiments provide a method for arranging the plurality of light sources 3000 on a printed circuit board 4100 at once, which is convenience.

The printed circuit board 4100 according to embodiments may be any substrate on which an electrical circuit is printed. That is, the printed circuit board 4100 may not be limited to a name thereof, and may have, for example, a transparent or opaque characteristic. In addition, the printed circuit board 4100 may be, for example, a single-sided circuit board with the electric circuit printed only on one surface thereof, or may be a double-sided circuit board with the electric circuits printed on both surfaces thereof.

As shown in FIG. 11 and (c) in FIG. 12. the method for manufacturing the display module 4000 according to embodiments includes forming the molding film 2400 covering the plurality of light sources 3000 and one surface of the base 4100 (s1102).

The molding film 2400 according to embodiments may be formed to surround both top surfaces and side surfaces of the light source 3000 and the printed circuit board 4100. Accordingly, the display module 4000 to be formed may be further prevented from being deteriorated by the outside. Alternatively, the molding film 2400 may be formed to surround entire surfaces of the light source 3000 and the top surface of the printed circuit board 4100. Accordingly, the display module 4000 to be formed may be prevented from being deteriorated by the outside, and an amount of consumed material may be reduced. Alternatively, the molding film 2400 may be formed such that at least a portion of the light source 3000 or the printed circuit board 4100 is exposed to the outside. Accordingly, the display module 4000 to be formed may be formed such that a portion thereof required to be connected to the outside is connectable to the outside, and at the same time, a portion requiring protection from the outside is protected. Detailed contents of s1102 are the same as or similar to s703 in FIG. 7 and (e) in FIG. 8, and thus will be omitted.

As shown in FIG. 11 and (d) in FIG. 12, the method for manufacturing the display module 4000 according to embodiments includes polishing the molding film 2400 such that the bonding portion 2300 is exposed (s1103). Detailed contents of s1103 are the same as or similar to s704 in FIG. 7 and (f) in FIG. 8. and thus will be omitted.

As shown in FIG. 11 and (e) in FIG. 12. the method for manufacturing the display module 4000 according to embodiments includes printing a wiring electrode 4200 connected to the bonding portion 2300 on the molding film 2400 (s1104). Accordingly, the light source 3000 included in the display module 4000 may be electrically connected to the outside via the bonding portion 2300 and the wiring electrode 4200.

As shown in FIG. 11 and (f) in FIG. 12, the method for manufacturing the display module 4000 according to embodiments may further include forming one or more vias 4300 connected to the wiring electrode 4200 (s1105). Accordingly, the display module 4000 may form a conductive channel. In addition, the wiring electrode 4200 may be electrically connected to an electrode formed on a rear surface or the external device via the via 4300.

The display module 4000 formed via the embodiments described in FIGS. 11 and 12, as the display module 4000 in which the plurality of light sources 3000 are arranged at the desired spacing, may include the printed circuit board 4100 including the plurality of light sources 3000 including the bonding portions 2300, the molding film 2400 covering portions of the plurality of light sources 3000 and the printed circuit board 4100, and the wiring electrode 4200 printed on the molding film 2400 to be connected to the bonding portion 2300. In addition, the display module 4000 may further include the via 4300 formed in the molding film to be connected to the wiring electrode 4200.

As shown in FIGS. 11 and 12, the method for manufacturing the display device according to embodiments of the present disclosure provides the method for easily manufacturing the display device. In addition, the embodiments provide a method for further reducing the manufacturing cost by presenting the manufacturing method of forming the via in the molding film, unlike the expensive TSV process of forming the via in the silicon wafer. In addition, the embodiments provide a method for manufacturing a display device having a high process yield of the driver without requiring the separate SMT manufacturing process.

Figure 13:
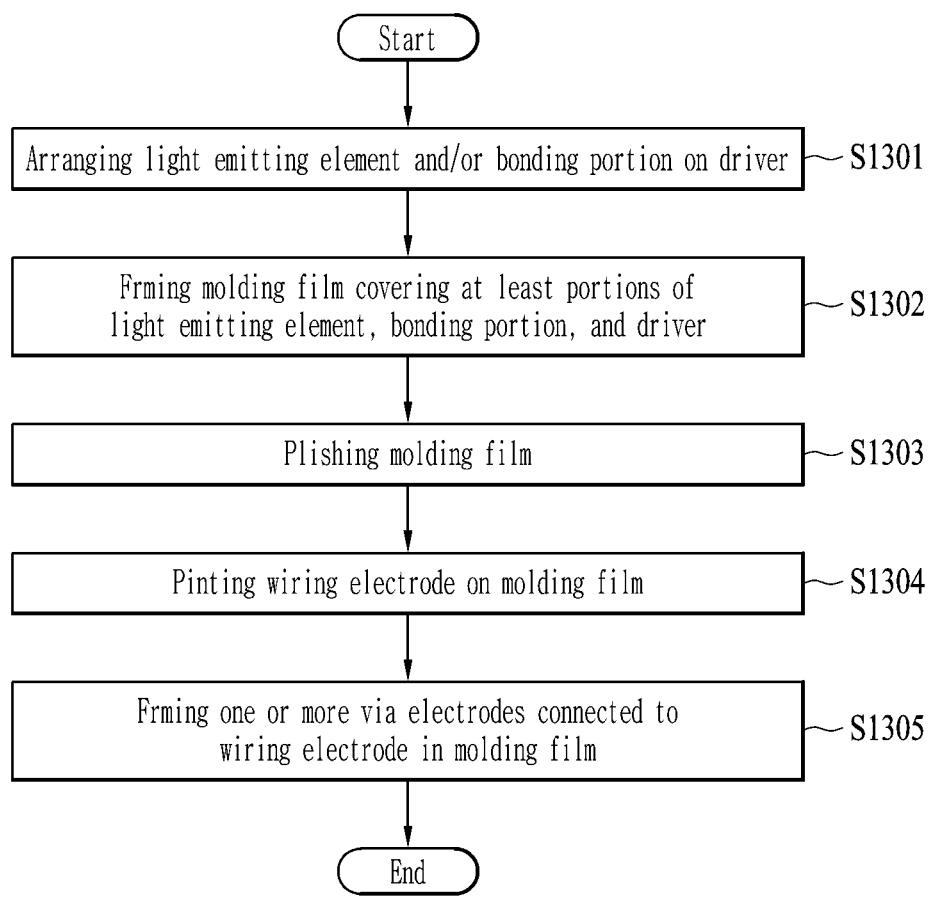
FIG. 13 is a flowchart of a method for manufacturing a display module according to embodiments.
Figure 14:
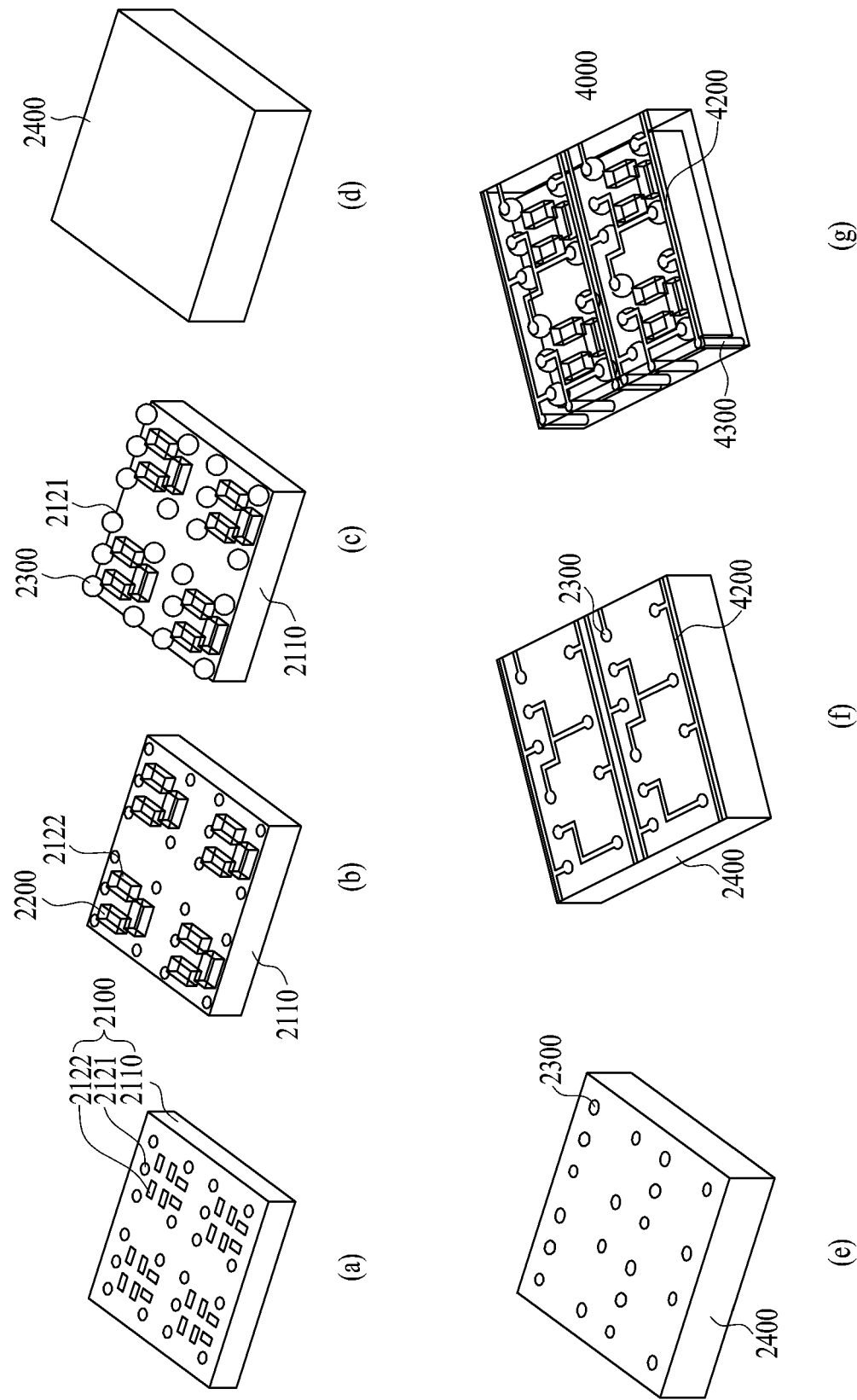
FIG. 14 is a schematic view of a method for manufacturing a display module described in FIG. 13.

FIGS. 13 and 14 illustrate another embodiment of manufacturing a display device according to embodiments using the light emitting element package described via the examples in FIGS. 3 to 10.

FIG. 13 is a flowchart of a method for manufacturing a display module according to embodiments.

FIG. 14 is a schematic view of a method for manufacturing a display module described in FIG. 13.

Although 4000 is described as the display module in FIGS. 13 and 14 for convenience of description, the display module may be included in or equal to the display device, so that the terms 'display module' and 'display device' may be used interchangeably. That is, the display device 1000 described in FIG. 1 may be the same as the display module 4000 described in FIGS. 13 and 14. Alternatively, the display device 1000 described in FIG. 1 may include a plurality of display modules 4000 described in FIGS. 13 and 14.

s1301 to s1305 in FIG. 13 and (a) to (g) in FIG. 14 sequentially illustrate the method for manufacturing the display module 4000.

As shown in FIG. 13 and (a) to (c) in FIG. 14, the method for manufacturing the display module 4000 according to embodiments includes providing the base including the plurality of light sources 3000 including the bonding portions 2300 (s1301).

Specifically, the providing of the base may include providing the driver 2100; and disposing one or more light emitting elements 2200 and/or one or more bonding portions 2300 on the driver 2100.

In this regard, as described above with reference to FIGS. 3 to 12, the driver 2100 may include the substrate 2110 having the plurality of first pads 2121 and the plurality of second pads 2122 formed on one surface thereof. In addition, the light emitting element 2200 may be disposed to be electrically connected to the second pad 2122. In addition, the bonding portion 2300 may be disposed to be electrically connected to the first pad 2121.

Detailed contents of s1301 are the same as or similar to s501 to s503 in FIG. 5 and (a) to (c) in FIG. 6, and thus will be omitted.

As shown in FIG. 13 and (d) in FIG. 14. the method for manufacturing the display module 4000 according to embodiments includes forming the molding film 2400 covering at least portions of the light emitting element 2200, the bonding portion 2300, and the driver 2100 (s1302). Detailed contents of s1302 are the same as or similar to s703 in FIG. 7. (c) in FIG. 8, s1102 in FIG. 11, and (c) in FIG. 12, and thus will be omitted.

As shown in FIGS. 13 and (e) in FIG. 14, the method for manufacturing the display module 4000 according to embodiments includes polishing the molding film 2400 such that at least a portion of the bonding portion 2300 is exposed (s1303). Detailed contents of s1303 are the same as or similar to s704 in FIG. 7 and (f) in FIG. 8, and thus will be omitted.

As shown in FIG. 13 and (f) in FIG. 14, the method for manufacturing the display module 4000 according to embodiments may include printing the wiring electrode 4200 connected to the bonding portion 2300 on the molding film 2400 (s1304). Detailed contents of s1304 are the same as or similar to s1104 in FIG. 11 and (e) in FIG. 12, and thus will be omitted.

As shown in FIG. 13 and (g) in FIG. 14, the method for manufacturing the display module 4000 according to embodiments may further include forming one or more vias 4300 connected to the wiring electrode 4200 (s1305).

The display module 4000 formed via the embodiments described in FIGS. 13 and 14, as the display module 4000 with the simplified manufacturing process and the reduced manufacturing cost, includes the base including the plurality of light sources 3000 including the bonding portions 2300, the molding film 2400 covering at least a portion of the base, and the wiring electrode 4200 printed on the molding film 2400 to be connected to the bonding portion 2300. In addition, the display module 4000 may further include the via 4300 formed in the molding film 2400 to be connected to the wiring electrode 4200.

As shown in FIGS. 13 and 14, the method for manufacturing the display device according to embodiments of the present disclosure provides the method for easily manufacturing the display device. In addition, the embodiments provide a method for further reducing the manufacturing cost by presenting the manufacturing method of forming the via in the molding film, unlike the expensive TSV process of forming the via in the silicon wafer. In addition, the embodiments may set the cutting unit based on the process yield of the driver and perform the cutting based on the cutting unit, thereby efficiently utilizing the display device.

The terms first, second, and the like used herein may be used to describe various components according to the embodiments. However, the various components according to the embodiments should not be limited by the above terms. Such terms are only used to distinguish one component from another. For example, a first learning model may be referred to as a second learning model, and similarly, the second learning model may be referred to as the first learning model, and such a change should be interpreted as not departing from the scope of the various embodiments described above. Although both the first learning model and the second learning model are learning models, they are not to be interpreted as the same virtual object unless the context clearly indicates otherwise.

Herein, "or" may be interpreted as "and/or". For example, "A or B" may mean 1) a case of representing only A. 2) a case of representing only B, and/or 3) a case of representing A and B. In other words, the term "or" may mean "additionally or alternatively".

That is, although the description has been made herein with reference to the accompanying drawings, this is only an embodiment. The present disclosure is not limited to the specific embodiment, and various contents that may be modified by a person skilled in the art to which the present disclosure pertains belongs to the scope of the right based on the claims. Further, such modifications should not be individually understood from the technical idea of the present disclosure.

In addition, although the preferred embodiment has been illustrated and described above, the present disclosure is not limited to the specific embodiment described above, but various modifications may be made by one of ordinary skill in the art to which the present disclosure pertains without departing from the subject matter of the present disclosure claimed in the claims, and such modifications should not be individually understood from the technical idea or the prospect of the present disclosure.

Further, herein, both the product invention and the process invention are described, and the description of both inventions may be complementally applied as necessary.

It is understood by those skilled in the art that various changes and modifications may be made without departing from the spirit or the scope of the present disclosure. Accordingly, it is intended that the present disclosure includes the changes and the modifications of the present disclosure provided within the appended claims and their equivalents.

Both the product invention and the process invention are referred to herein, and descriptions of both the product invention and the process invention may be applied in complementary fashion to each other.

Industrial Applicability

The embodiments are industrially applicable.

What is claimed is:

1. A display device comprising:
   a base including:
     a plurality of light sources including bonding portions; and
     a printed circuit board (PCB) having the plurality of light sources arranged on a surface of the PCB;
   a molding film covering the plurality of light sources;
   a wiring electrode on the molding film to be connected to the bonding portions; and
   a via formed in the molding film to be connected to the wiring electrode,
   wherein each of the plurality of light sources includes at least one light emitting element and a driver configured to control the at least one light emitting element and electrically connected to the at least one light emitting element,
   wherein the at least one light emitting element and the driver are positioned on a same side of the PCB,
   wherein the driver includes a substrate,
   wherein the at least one light emitting element is provided as a plurality of light emitting elements,
   wherein the plurality of light emitting elements are arranged in clusters on a surface of the substrate, and covered by the molding film, and
   wherein the bonding portions are arranged on the surface of the substrate to encircle a cluster among the clusters of the plurality of light emitting elements.

2. The display device of claim 1, wherein the bonding portions include at least one of a solder ball, a copper bump, and a solder paste.

3. The display device of claim 1, wherein the bonding portions include at least one of a solder ball, a copper bump, and a solder paste.

4. The display device of claim 1, wherein the at least one light emitting element emits light in one of red (R) color, green (G) color and blue (B) color.

5. The display device of claim 1, wherein a cross-sectional area of the at least one light emitting element is greater than a cross-sectional area of the driver in a plan view.

6. The display device of claim 1, wherein the molding film covers the plurality of light sources and the PCB.

7. The display device of claim 6, wherein the wiring electrode is located on a surface of the molding film so that molding film is interposed between the PCB and the wiring electrode.

8. The display device of claim 1, wherein the clusters are separated by a distance on the substrate.

9. The display device of claim 8, wherein each cluster is one of the plurality of light sources.

10. The display device of claim 1,
    wherein each of the plurality of light sources includes:
    the substrate having a first pad and a second pad formed on a surface of the substrate, and
    wherein the at least one light emitting element is electrically connected to the second pad.

11. The display device of claim 10, wherein the at least one light emitting element and the driver are disposed on the surface of the substrate,
    wherein the driver is electrically connected to the first pad, and
    wherein an electrical wiring disposed on the surface of the substrate is connected to the first pad and the second pad.

12. The display device of claim 11, wherein at least one of the first pad, the second pad and the electrical wiring includes at least one of Cu, Ag, Al, Ni, Ti, Cr, Pd, Au and Sn.

13. The display device of claim 1, wherein each of the plurality of light sources includes the at least one light emitting element disposed on a surface of the driver,
    wherein the driver includes a first pad and a second pad which are formed on the surface of the substrate, and
    wherein the at least one light emitting element is connected to the second pad and a bonding portion among the bonding portions is connected to the first pad.

14. The display device of claim 13, wherein a first size of the first pad is greater than a second size of the second pad.

15. The display device of claim 13, further comprising an electrical wiring on the surface of the substrate to connect the first pad to the second pad.

16. The display device of claim 15, wherein the electrode wiring is exposed on the surface of the substrate.

17. The display device of claim 15, wherein at least one of the first pad, the second pad and the electrical wiring includes at least one of Cu, Ag, Al, Ni, Ti, Cr, Pd, Au and Sn.

* * * * *